(12) United States Patent
Mori et al.

(10) Patent No.: US 6,900,627 B2
(45) Date of Patent: *May 31, 2005

(54) APPARATUS AND METHOD FOR TESTING SEMICONDUCTOR INTEGRATED CIRCUIT

(75) Inventors: Hisaya Mori, Hyogo (JP); Shinji Yamada, Hyogo (JP); Teruhiko Funakura, Tokyo (JP)

(73) Assignees: Renesas Technology Corp., Tokyo (JP); Renesas Semiconductor Engineering Corporation, Hyogo (JP)

( * ) Notice: Subject to any disclaimer, the term of this patent is extended or adjusted under 35 U.S.C. 154(b) by 231 days.

This patent is subject to a terminal disclaimer.

(21) Appl. No.: 09/927,368

(22) Filed: Aug. 13, 2001

(65) Prior Publication Data

US 2002/0105352 A1 Aug. 8, 2002

(30) Foreign Application Priority Data

Feb. 8, 2001 (JP) .................................... 2001-032596

(51) Int. Cl.$^7$ .......................... G01R 1/04; G01R 31/02
(52) U.S. Cl. .................................... 324/158.1; 324/754
(58) Field of Search ...................... 324/158.1, 754–765; 714/724–734, 742; 323/316

(56) References Cited

U.S. PATENT DOCUMENTS

| | | | | |
|---|---|---|---|---|
| 4,583,223 A | * | 4/1986 | Inoue et al. | 714/724 |
| 5,414,365 A | * | 5/1995 | Coggins et al. | 324/607 |
| 5,436,558 A | * | 7/1995 | Saitoh et al. | 324/763 |
| 5,509,019 A | * | 4/1996 | Yamamura | 714/718 |
| 5,646,521 A | * | 7/1997 | Rosenthal et al. | 324/158.1 |
| 5,999,008 A | * | 12/1999 | Currin et al. | 324/763 |
| 6,255,842 B1 | * | 7/2001 | Hashimoto | 324/763 |
| 6,628,137 B2 | * | 9/2003 | Mori et al. | 324/765 |
| 6,642,736 B2 | * | 11/2003 | Mori et al. | 324/763 |
| 6,661,248 B2 | * | 12/2003 | Mori et al. | 324/765 |
| 2001/0034865 A1 | * | 10/2001 | Park et al. | 714/724 |
| 2002/0107654 A1 | * | 8/2002 | Mori et al. | 702/120 |
| 2002/0108080 A1 | * | 8/2002 | Mori et al. | 714/725 |

FOREIGN PATENT DOCUMENTS

| | | |
|---|---|---|
| DE | 196 31 005 A1 | 2/1997 |
| DE | 101 45 152 A1 | 6/2002 |
| JP | 1-316024 | * 12/1989 |
| JP | 08-233912 | 9/1996 |
| JP | 09-189750 | 7/1997 |
| JP | 2000-356724 | 12/2000 |
| JP | P2000-162450 A | 6/2002 |

OTHER PUBLICATIONS

Data sheet '64 Mb SDRAM, pp. 1–4, Micron Technology, Inc.

* cited by examiner

*Primary Examiner*—David Zarneke
*Assistant Examiner*—Jermele Hollington
(74) *Attorney, Agent, or Firm*—McDermott Will & Emery LLP (57) ABSTRACT

A test ancillary device with data memory and an analysis section is disposed in the vicinity of a test circuit board. The data memory is divided into two memory sections such that, when digital test data are stored in one memory section, the digital test data that have already been stored in the other memory section are loaded for analysis purpose.

11 Claims, 11 Drawing Sheets

APPARATUS AND METHOD FOR TESTING SEMICONDUCTOR INTEGRATED CIRCUIT

BACKGROUND OF THE INVENTION

1. Field of the Invention

The present invention relates to an apparatus for testing a semiconductor integrated circuit. More particularly the present invention relates to an apparatus for testing a semiconductor integrated circuit including an analog-to-digital converter circuit for converting an analog signal into a digital signal or a digital-to-analog converter circuit for converting a digital signal into an analog signal, as well as to a method of testing a semiconductor integrated circuit using the apparatus.

2. Background Art

An apparatus for testing a semiconductor integrated circuit is called a tester. Recently, in relation to a system LSI embodied in a one-chip semiconductor integrated circuit (a one-chip LSI) consisting of a plurality of functionally-systematized circuit modules or embodied in a hybrid integrated circuit (a chip set LSI), combination of high-performance and precision digital and analog circuits (i.e., a system LSI handling a mixed signal) has been rapidly pursued. Even in relation to a test apparatus for use with a semiconductor integrated circuit, development of a test apparatus capable of handling a mixed signal is also pursued. Tester manufacturers have provided testers compatible with a semiconductor integrated circuit using a mixed signal.

A tester compatible with a semiconductor integrated circuit using a mixed signal has a tendency to become expensive in the course of ensuring compliance with high performance specifications. For this reason, moves are afoot to recycle an existing low-speed, low-precision tester which has been used for, e.g., a logic LSI, to thereby avoid a hike in the price of a tester.

A big problem with such a test apparatus lies in a test for a digital-to-analog converter circuit (DAC) for converting a digital signal into an analog signal as well as in a test for an analog-to-digital converter circuit (ADC) for converting an analog signal into a digital signal. In association with an increase in the precision of the characteristic test, embodiment of a low-cost test apparatus compatible with a semiconductor integrated circuit including the DAC and ADC has posed a challenge.

In a testing environment of a general tester, a plurality of DUT (device under test) circuit boards (simply called "DUT boards") and connection jigs for connecting a tester with a DUT, such as cables, are provided at a plurality of points along a measurement path extending from measurement equipment in the tester to DUT. The measurement path is long and accounts for occurrence of noise and a drop in measurement accuracy. Further, simultaneous testing of a plurality of DUTs is also difficult. A limitation is imposed on the speed of a low-speed tester, and hence the low-speed tester cannot conduct a test at a real operating speed, thereby posing a fear of an increase in a time required for conducting mass-production testing of a system LSI.

Japanese Patent Application Laid-Open No. 316024/1989 describes a tester. The tester is equipped with a memory device for storing conversion data at an address designated by input data which have entered into a DAC of a test circuit. An analog signal which has been subjected to digital-to-analog conversion is input to an ADC, and an output from the ADC is sequentially stored in the memory device. After conversion of all the input data sets has been completed, the conversion data stored in the memory device are sequentially delivered to a tester. The tester sequentially compares the input data with the conversion data, thus producing a test conclusion.

However, the tester must supply data to be input to the DAC, an address to be used for storing conversion data into a memory device, and a control signal. Moreover, data stored in the memory device must be supplied to the tester. Further, there is the probability that noise arising in a long measurement path extending from the tester to a DUT may deteriorate precision of measurement. Further, the majority of pin electronics provided on the tester are occupied for testing a single DUT, thereby posing a difficulty in simultaneous measurement of a plurality of DUTs. Further, communication for transmitting conversion data to the tester is time consuming, and test conclusions are produced after completion of all tests. Hence, shortening of a test time is also difficult.

SUMMARY OF THE INVENTION

The present invention provides an apparatus for testing a semiconductor integrated circuit which includes an analog-to-digital converter circuit or a digital-to-analog converter circuit.

According to one aspect of the present invention, the apparatus comprises a test circuit board and a test ancillary device disposed in the vicinity of the test circuit board. The test circuit board is constructed so as to exchange a signal with the semiconductor integrated circuit under test. The test ancillary device has data memory for storing digital test data and an analysis section for analyzing the digital test data stored in the data memory. The digital test data is output from the analog-to-digital converter circuit or is produced by converting the analog test data output from the digital-to-analog converter circuit into a digital signal. The data memory is divided into two memory sections such that, when digital test data are stored in one memory section, the digital test data that have already been stored in the other memory section are loaded for analysis purpose.

Other and further objects, features and advantages of the invention will appear more fully from the following description.

DETAILED DESCRIPTION OF THE PREFERRED EMBODIMENTS

The present inventor has proposed, in Japanese Patent Application No. 356724/2000, a test apparatus for testing a semiconductor integrated circuit which enables implementation of high-speed, high-precision measurement at low cost.

The present invention is aimed at proposing a test apparatus for testing a semiconductor integrated circuit which enables testing of a semiconductor integrated circuit at higher speed and more efficiently, by means of improving the thus-proposed test apparatus further.

Figure 1A:
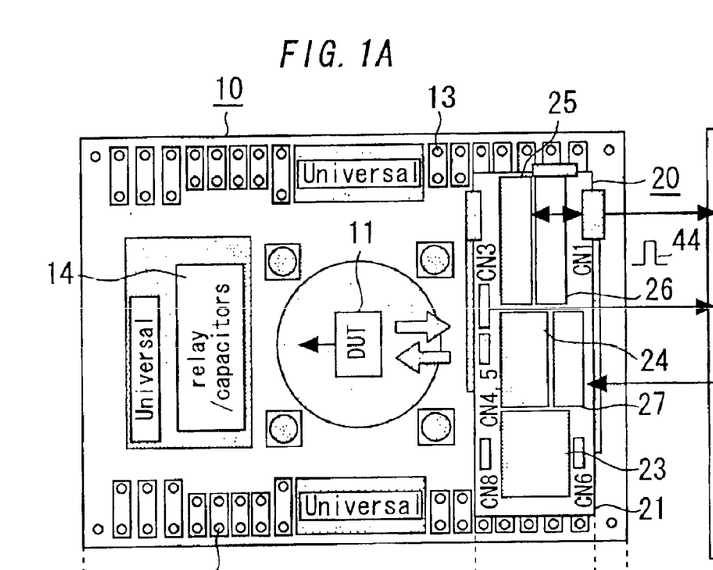
FIGS. 1A through 1C are schematic diagrams showing the configuration of a test apparatus for testing a semiconductor integrated circuit according to a first embodiment of the present invention.
Figure 1B:
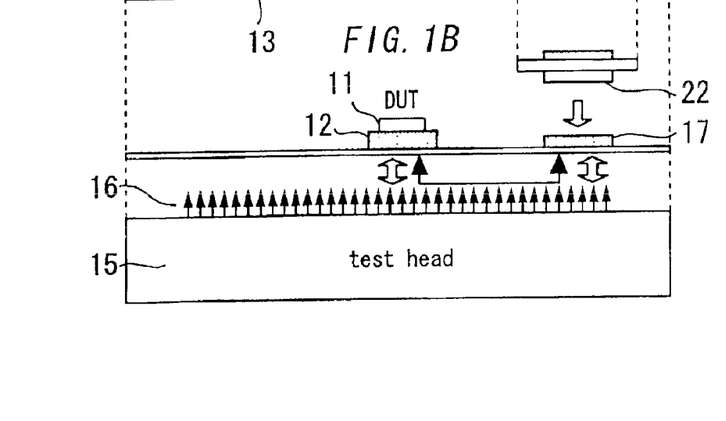
Figure 1C:
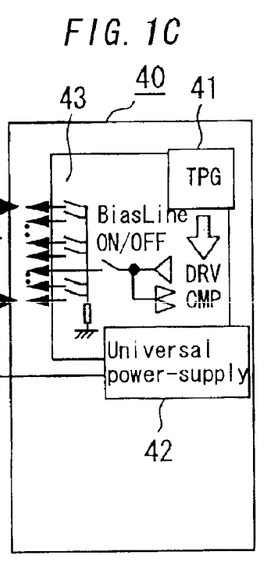

The present invention also proposes a test method of testing a semiconductor integrated circuit which enables testing of a semiconductor integrated circuit at higher speed and more efficiently, through use of the test apparatus.
First Embodiment FIGS. 1A through 1C are schematic diagrams showing the configuration of a test apparatus for testing a semiconductor integrated circuit according to a first embodiment of the present invention. FIG. 1A is a top view of a test circuit board (a DUT board); FIG. 1B is a side view of the test circuit board; and FIG. 1C is a schematic diagram showing the configuration of a test machine (tester).

The test apparatus according to the first embodiment comprises a test circuit board (DUT board) 10; a test ancillary device 20; and a tester 40.

In the first embodiment, the DUT board 10 is designed for testing a molded IC as a semiconductor integrated circuit under test (DUT) 11. A molded IC is a semiconductor integrated circuit (IC) chip which is coated with mold resin such that a plurality of terminals are led outside from the mold resin. The IC chip mounted on the DUT 11 is, for example, a one-chip system LSI of mixed signal type. A DAC for converting a digital signal into an analog signal and an ADC for converting an analog signal into a digital signal are provided within a single chip. A hybrid integrated circuit (IC) of mixed signal type comprising a plurality of chips mounted on a common circuit board maybe employed as the DUT 11.

The test circuit board 10 has a DUT socket 12 for receiving terminals of the DUT 11. A plurality of connection terminals 13 and a cluster of relay capacitors 14 for test purposes are provided around the DUT socket 12.

A test head 15 is located below the test circuit board 10. The test head 15 has a plurality of connection pins 16 to be connected to the test circuit board 10. Signals required for a test are exchanged with the DUT 11 by way of the connection pins 16.

A test ancillary device (BOST device) 20 is provided in the vicinity of the test circuit board 10. In the first embodiment, the test ancillary device 20 is constituted on a test ancillary board (BOST board) 21. The BOST board 21 is to be mounted on the DUT board 10. A socket 17 is fixedly provided on the DUT board 10 for receiving the BOST board 21. A connector 22 to be fitted to the socket 17 is provided on a lower surface of the BOST board 21, and the connector 22 is fitted to the socket 17. As a result, the BOST board 21 is supported on the DUT board 10, so that signals are exchanged with the test head 15 by way of the socket 17.

The word "BOST" in BOST board 21 stands for built-off-self-test. Hence, the BOST board 21 is an external test ancillary device (built-off-self-test device) for assisting a test circuit which causes a DUT to perform a built-in self-test therein without dependence on the tester 40. The BOST board 21 has an AD/DA measurement section 23, a control section 24, a DSP analysis section 25, a memory section 26, and a power supply section 27.

The tester 40 has a test pattern generator (hereinafter simply called a "TPG") 41, a power supply section 42, and a pin electronic section 43. The tester 40 supplies a supply voltage Vd to the BOST board 21, thus exchanging control signals 44 with the BOST board 21. The control signals 44 include a test analysis result signal sent from the BOST board 21 to the tester 40 as well as instruction signals sent from the tester 40 to the BOST board 21 and to the DUT board 10. The control signals 44 including a test analysis number code to be input to the BOST board 21 from the tester 40 are produced as test pattern signals by the TPG 41 built in the tester 40 in compliance with test signal requirements described in a test program, as in the case of a test conducted on another DUT 11. The control signals 44 are supplied to the BOST board 21 and the DUT board 10, by way of the pin electronic section 43 of the tester 40 having a plurality of signal I/O pins. A test analysis result (pass/fail information) output from the BOST board 21 is delivered to the pin electronic section 43 of the tester 40. A determination section of the pin electronic section 43 acquires information about the test analysis result by comparison with a test pattern signal and through analysis of a comparison result.

Figure 2:
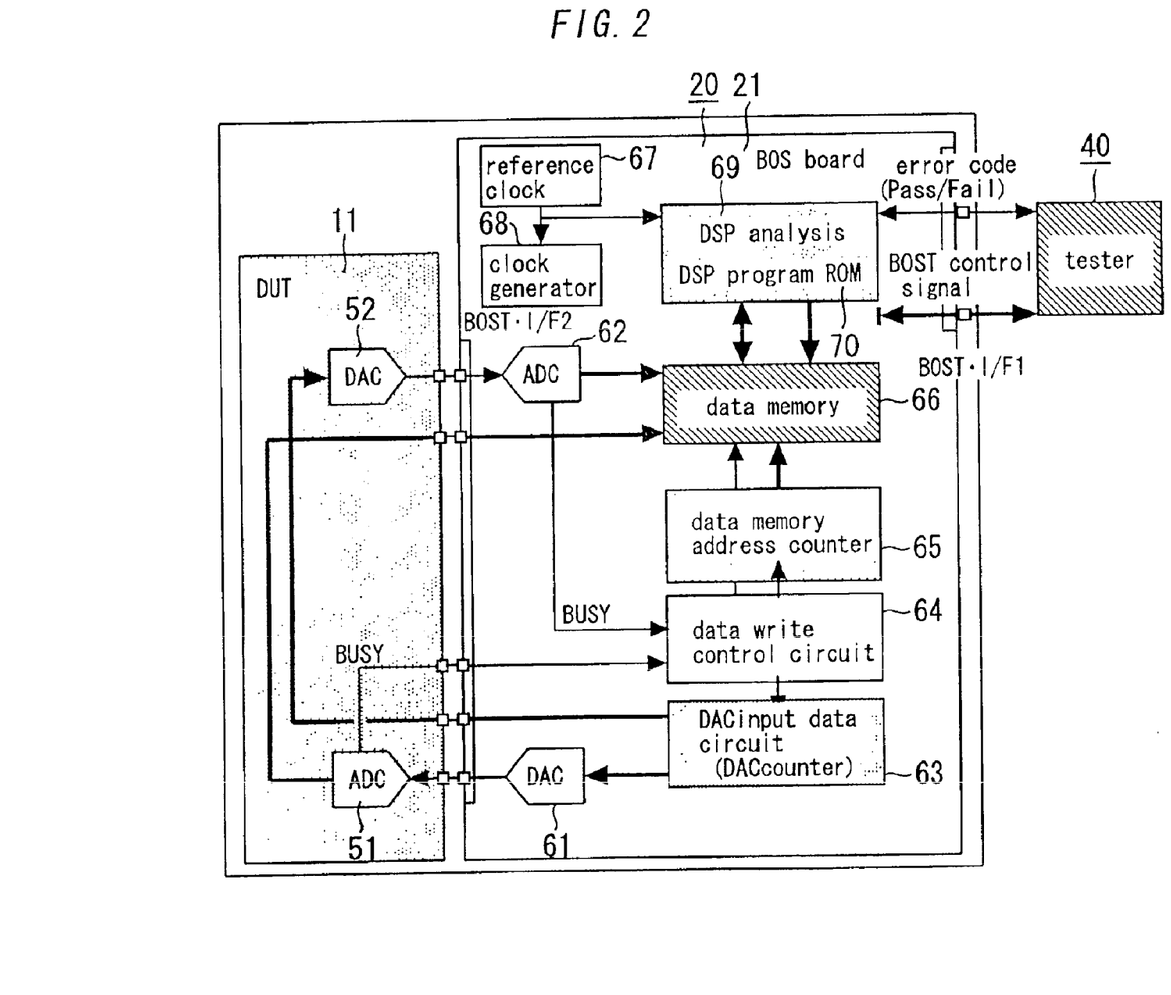
FIG. 2 is a block diagram showing the configuration of an electric circuit provided in the test apparatus according to the first embodiment.

FIG. 2 is a block diagram showing the configuration of an electric circuit provided in the test apparatus according to the first embodiment. The DUT 11 comprises an analog-to-digital converter circuit 51 for converting an analog signal into a digital signal, and a digital-to-analog converter circuit 52 for converting a digital signal into an analog signal.

The BOST board 21 has a digital-to-analog converter circuit 61 for test purpose which supplies an analog test signal to the ADC 51 of the DUT 11, and an analog-to-digital converter circuit 62 for test purpose which converts an analog test output produced by the digital-to-analog converter circuit 52 of the DUT 11 into a digital test output. Moreover, the BOST board 21 comprises a DAC input data circuit (DAC counter) 63; a data write control circuit 64; a measured data memory address counter 65; measured data memory 66; a reference clock signal circuit 67; a clock signal generator circuit 68; and a DSP analysis section 69. The DSP analysis section 69 has DSP program ROM 70.

The digital-to-analog converter circuit 61, the analog-to-digital converter circuit 62, the DAC input data circuit 63, the data write control circuit 64, and the measured data memory address counter 65 are included in the AD/DA measurement section 23 shown in FIGS. 1A through 1C. The measured data memory 66 is included in the memory section 26, and the DSP analysis section 69 is included in the DSP analysis section 25.

By means of such a configuration, a digital test signal (i.e., test data) is stored in the DAC input data circuit 63. In accordance with an instruction from the tester 40, the test data are supplied from the DAC input data circuit 63 to the digital-to-analog converter circuit 52 of the DUT 11 and to the digital-to-analog converter circuit 61 of the BOST board 21.

The digital test data signal (i.e., test data) supplied to the digital-to-analog converter circuit 61 is converted into an analog test signal, and the analog test signal is supplied to the analog-to-digital converter circuit 51. The analog-to-digital converter circuit 51 converts the analog test signal into a digital test output, and the digital test output is supplied to the measured data memory 66.

Meanwhile, the test data which have been supplied directly to the digital-to-analog converter circuit 52 of the DUT 11 from the DAC input data circuit 63 are converted into an analog test output by the digital-to-analog converter circuit 52. The analog test output is converted into a digital test output by means of the analog-to-digital converter circuit 62 of the BOST board 21. The digital test output is supplied to the measured data memory 66. The measured data memory 66 sequentially stores to predetermined addresses the digital test output supplied from the analog-to-digital converter circuit 51 of the DUT 11, and the digital test output supplied from the digital-to-analog converter circuit 52 by way of the ADC 62.

The analog-to-digital converter circuit 51 of the DUT 11 and the analog-to-digital converter circuit 62 of the BOST board 21 convert an analog signal into a digital signal, sequentially. Every time a single digital signal is output, the analog-to-digital converter circuit 51 and the analog-to-digital converter circuit 62 each output a BUSY signal. The BUSY signals are supplied to the data write control circuit 64 provided on the BOST board 21. On the basis of the thus-supplied BUSY signals, the data write control circuit 64 sequentially advances the digital test data pertaining to the DAC input data circuit 63 to the next digital test data on a per-data-set basis. Further, the data write control circuit 64 acts on the measured data memory address counter 65 so as to sequentially advance an address of the measured data memory 66.

As mentioned above, a code of the digital test data to be converted by the DUT 11 is advanced based on the BUSY signals by the DAC input data circuit 63. As a result of sequential advancement of an address on the measured data memory 66 at which the digital test output converted by the DUT 11 is to be stored, the ADC 51 and the DAC 52 provided in the DUT 11 sequentially pursue conversion required by a test. The thus-converted measured data are sequentially stored in the measured data memory 66. In subsequent processes, conversion tests proceed until a final code set by the DSP analysis section 69 on the BOST board 21 is achieved, and the results of all conversion tests are stored in the measured data memory 66.

The DSP analysis section 69 provided on the BOST board 21 sequentially reads conversion data stored in the measured data memory 66, through use of a program stored in the DSP program ROM 70, thus analyzing a conversion characteristic. The analysis includes computation of an analog-to-digital conversion characteristic parameter, a digital-to-analog conversion characteristic parameter, a differential linearity, and an integral nonlinearity error. An analysis result (pass/fail information) is sent from the BOST board 21 to the tester 40, wherein the tester 40 processes a test result.

In the first embodiment, the BOST board 21 is provided in the vicinity of the DUT board 10 and has the function of causing the analog-to-digital converter circuit 51 and digital-to-analog converter circuit 52 of the DUT 11 to perform conversion tests. The conversion tests can be effected on the BOST board 21. Consequently, an analog measurement system line provided between the DUT board 10 and the BOST board 21 can be shortened, and occurrence of a measurement error attributable to noise can be suppressed sufficiently. Thus, a high-precision test can be implemented, and a test can be carried out at a higher speed on the basis of a signal exchanged between the DUT board 10 and the BOST board 21 located in the vicinity thereof. An analog measurement system line can be obviated from an area between the BOST board 21 and the tester 40, thereby increasing the accuracy of a test. After required conversion tests have been completed on the BOST board 21, the results of conversion tests are sent to the tester 40. Thus, a test speed can be increased as compared with a case in which converted data are transmitted to the tester 40.

In the first embodiment, the conversion test function of the analog-to-digital converter circuit 51 and that of the digital-to-analog converter circuit 52 of the DUT 11 are implemented on the BOST board 21. Hence, there is no necessity of adding a powerful conversion test function to the tester 40. Hence, an increase in the cost of the tester 40 is prevented, thereby enabling diversion of a conventional low-speed tester to the test apparatus. When a tester 40 having a special measurement function is to be manufactured, limitations are imposed on expansion of capabilities of hardware configuration of a tester. Further, manufacture of such a tester 40 involves modifications to the tester itself, posing a fear of a hike in development costs. In the first embodiment, the test apparatus utilizes as standard equipment a TPG and pin electronics provided on a common tester. Configuration and control of a BOST board can be effected without being influenced by specifications of testers or restrictions. Thus, application of the test apparatus to various types of testers is feasible.

Figure 7:
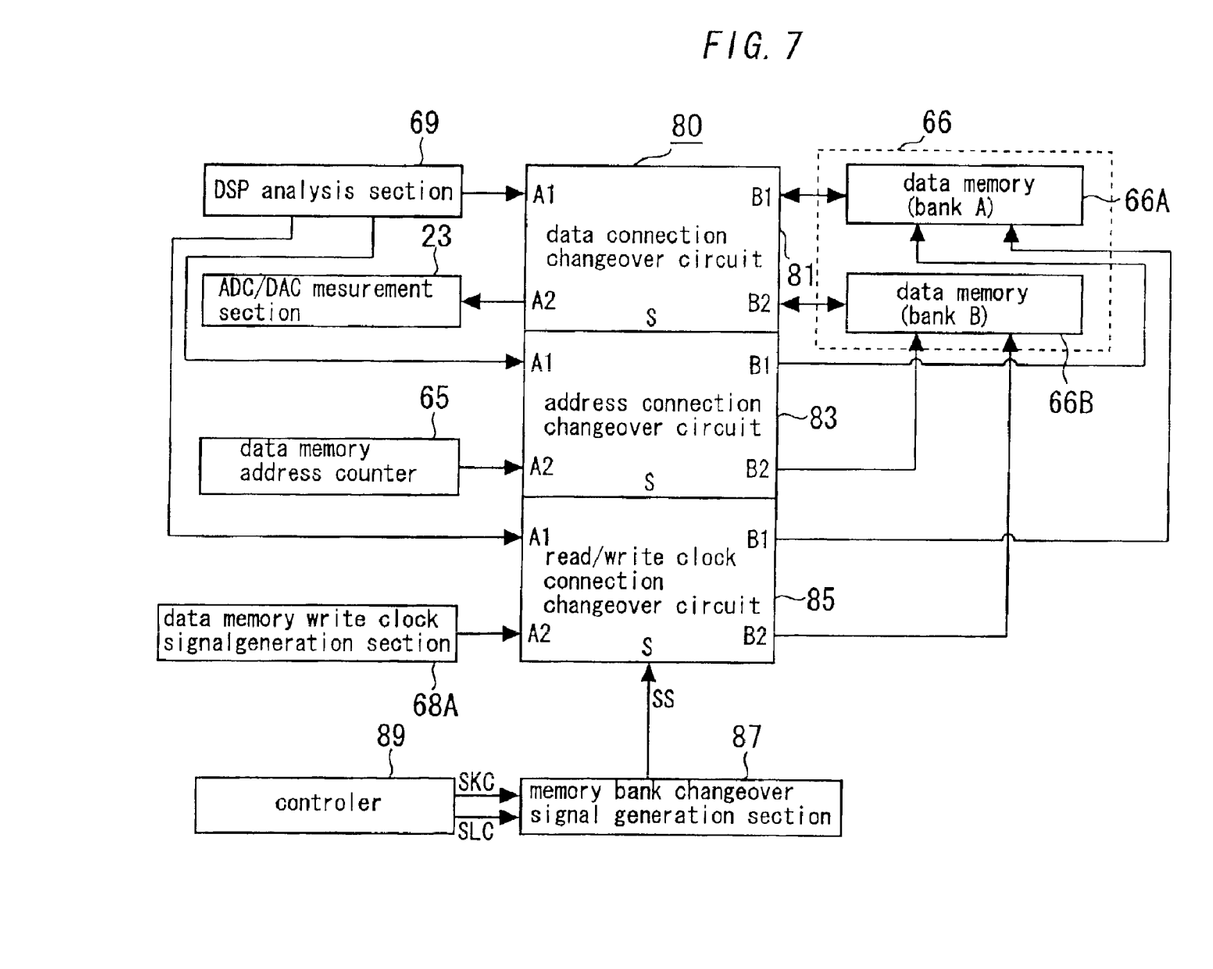
FIG. 7 is a block diagram of the memory/analysis changeover circuit.

In the first embodiment, a further improved memory/analysis changeover circuit 80 is employed in order to perform conversion tests for the analog-to-digital converter circuit 51 and the digital-to-analog converter circuit 52 of the DUT 11 in a more efficient manner and at higher speed. FIG. 7 is a block diagram of the memory/analysis changeover circuit 80.

As shown in FIG. 7, the measured data memory 66 is constituted of two memory devices; that is, a first memory device 66A, and a second memory device 66B. The first memory element 66A constitutes a memory bank A, and the second memory element 66B constitutes a memory bank B. Switching between the two memory devices 66A and 66B is controlled by means of three connection changeover circuits 81, 83, and 85. Each of the first, second, and third connection changeover circuits 81, 83, and 85 has an A1 terminal, an A2 terminal, a B1 terminal, a B2 terminal, and an S terminal. The first connection changeover circuit 81 is a data connection changeover circuit and effects switching between flow of data with respect to the memory device 66A and flow of data with respect to the memory device 66B. An A1 terminal of the data connection changeover circuit 81 is connected to the DSP analysis section 69; an A2 terminal is connected to the AD/DA measurement section 23; a B1 terminal is connected to the memory device 66A; and a B2 terminal is connected to the memory device 66B.

The first changeover circuit 81 has two functions; that is, a read-data-for-analysis changeover function and a data write changeover function. The read-data-for-analysis changeover function is for connecting the A1 terminal connected to the DSP analysis section 69 to either a B1 or B2 terminal. The data write changeover function is for switchably connecting the A2 terminal connected to the AD/DA measurement section 23 to the B1 or B2 terminal. The data write changeover function is for switchably inputting the digital test data output from the AD/DA measurement section 23 into the memory device 66A or 66B. The read-data-for-analysis changeover function is for switchably reading data from the memory device 66A or 66B and uploading the thus-read data to the DSP analysis section 69.

The second changeover circuit 83 is an address connection changeover circuit and has two functions; that is, a read-data-for-analysis changeover function and an address changeover function. The read-data-for-analysis changeover function is for connecting the A1 terminal connected to the DSP analysis section 69 to either a B1 or B2 terminal. The address changeover function is for switchably connecting the A2 terminal connected to the measured data memory address counter 65 to the B1 or B2 terminal. The third changeover circuit 85 is a read/write clock connection changeover circuit and has two functions; that is, a read clock changeover function and a write clock changeover function. The read clock changeover function is for switchably connecting the A1 terminal connected to the DSP analysis section 69 to either the B1 or B2 terminal. The write clock changeover function is for switchably connecting the A2 terminal connected to the measured data memory write clock circuit 68A to either the B1 or B2 terminal.

Each of the first through third changeover circuits 81, 83, and 85 is switched between a first connection state and a second connection state. In the first connection state, the A1 terminal and the B1 terminal are connected together, and the A2 terminal and the B2 terminal are connected together. In the second connection state, the terminal A1 and the terminal B2 are connected together, and the terminal A2 and the terminal B1 are connected together. In the first connection state, the data connection changeover circuit 81 connects the memory bank 66A to the DSP analysis section 69 and connects the memory bank 66B to the AD/DA measurement section 23. In the first connection state, the digital test data output from the DA/AD measurement section 23 are written into the memory bank 66B. Further, the digital test data that have already been stored in the memory bank 66A are read and uploaded to the analysis section 69. Conversely, in the second connection state, the digital test data output from the DA/AD measurement section 23 are written into the memory bank 66A, and the digital test data that have already been stored in the memory bank 66B are read and uploaded to the analysis section 69.

In the first connection state, the address connection changeover circuit 83 supplies to the memory bank 66A the read address output from the DSP analysis section 69 and supplies to the memory bank 66B the write address output from the measured data memory address counter 65. Moreover, in the first connection state, the read/write clock connection changeover circuit 85 supplies to the memory bank 66A the read clock signal output from the DSP analysis section 69 and supplies to the memory bank 66B the write clock signal output from the measured data memory write clock signal generation section 68A.

In the second connection state, the address connection changeover circuit 83 supplies to the memory bank 66B the read address output from the DSP analysis section 69 and supplies to the memory bank 66A the write address output from the measured data memory address counter 65. Moreover, in the second connection state, the read/write clock connection changeover circuit 85 supplies to the memory bank 66B the read clock signal output from the DSP analysis section 69 and supplies to the memory bank 66A the write clock signal output from the measured data memory write clock signal generation section 68A.

Figure 8:
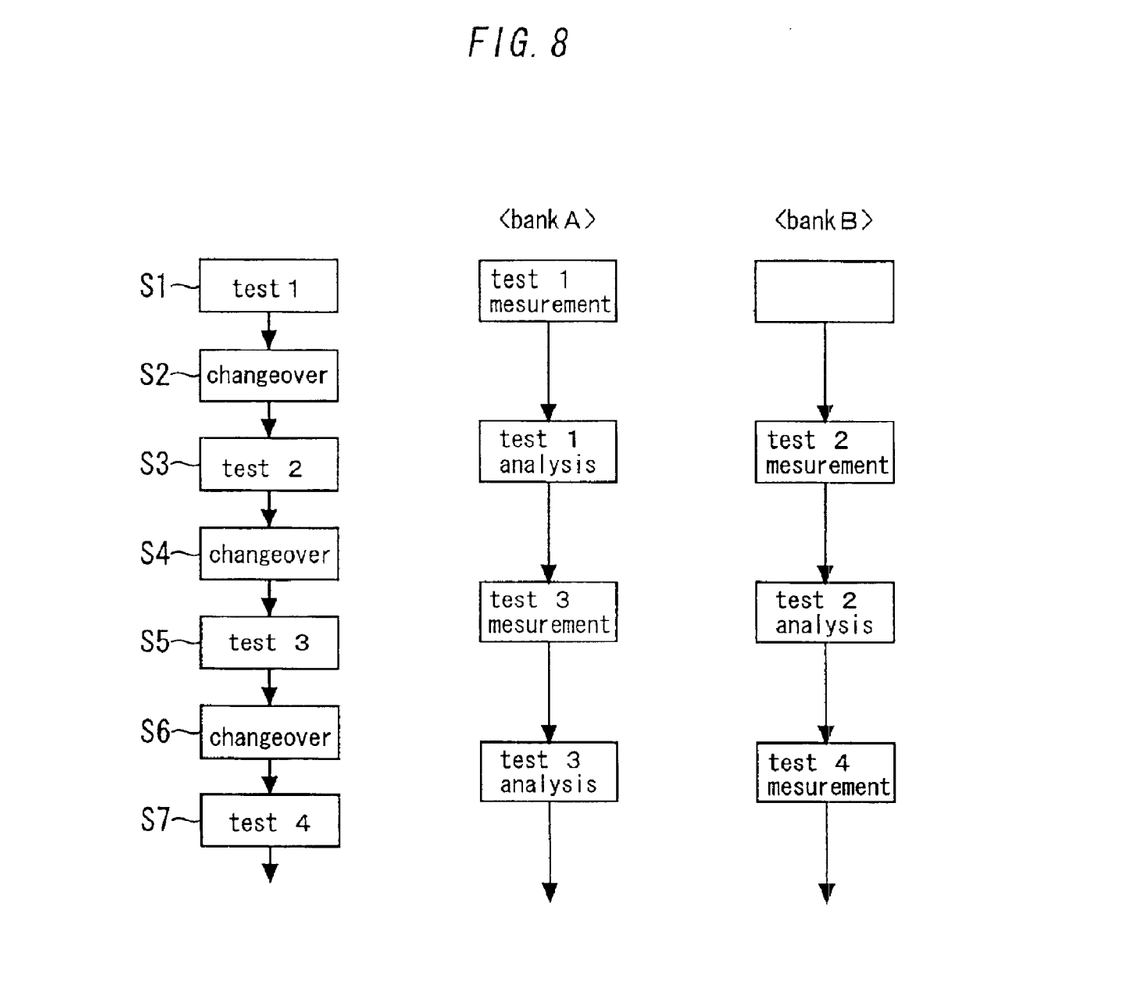
FIG. 8 is a flowchart showing a changeover process.

A memory bank changeover signal generation section 87 receives a memory changeover signal SKC and a clock-in signal SCL from a controller 89 of the semiconductor test apparatus, thereby generating a memory bank changeover signal SS. The memory bank changeover signal SS is supplied to an S terminal of each of the first through third changeover circuits 81, 83, and 85. Every time the memory bank changeover signal SS rises, the memory bank changeover signal SS switches each of the first through third changeover circuits 81, 83, and 85 between the first and second connection states. As a result, each of the first through third changeover circuits 81, 83, and 85 brings the memory bank 66A into the first or second connection state and brings the memory bank 66B into the second or first connection state, alternately. As shown in FIG. 8, the memory bank A is alternately brought into a measurement state and an analysis state, whereas the memory bank B is alternately brought into an analysis state and a measurement state. In the measurement state, digital test data output from the analog-to-digital converter circuit 51 of the AD/DA measurement section 23 and digital test data output from the digital-to-analog converter circuit 52 of the AD/DA measurement section 23 are input to a memory bank. In the analysis state, the thus-stored digital test data are uploaded to the DSP analysis section 69.

As shown in FIG. 8, in step S1 of the first test 1, the first through third changeover circuits 81, 83, and 85 are in the second connection state, in which the memory bank 66A is brought into a measurement state. In step S2, the memory bank changeover signal SS is supplied to the memory/analysis changeover circuit 80, thereby effecting switching between the memory banks 66A and 66B. In step S3 of test 2 in which the connection state has been reversed, the first through third changeover circuits 81, 83, and 85 are brought into the first connection state. As a result, the memory bank 66A is brought into a state in which test 1 is to be analyzed, and the memory bank 66B is brought into a state in which test 2 is to be measured. In step S4, the memory bank changeover signal SS is supplied to the memory/analysis changeover circuit 80, whereby switching between the memory banks 66A and 66B is effected. In step S5, the first through third changeover circuits 81, 83, and 85 are brought again into the second connection state. As a result, the memory bank 66A enters a state in which test 3 is to be measured, and the memory bank 66B enters a state in which test 2 is to be analyzed. In step S6, switching between the memory banks 66A and 66B is effected again. In step S7, the first through third changeover circuits 81, 83, and 85 are brought again into the first connection state. As a result, the memory bank 66A enters a state in which test 3 is to be analyzed, and the memory bank 66B enters a state in which test 4 is to be measured. In test 1, the memory bank B remains blank. The reason for this is that no measured data are stored in the memory bank B at the outset, and hence the blank data in the memory bank B eventually represent that no analysis operation is to be performed.

Figure 9:
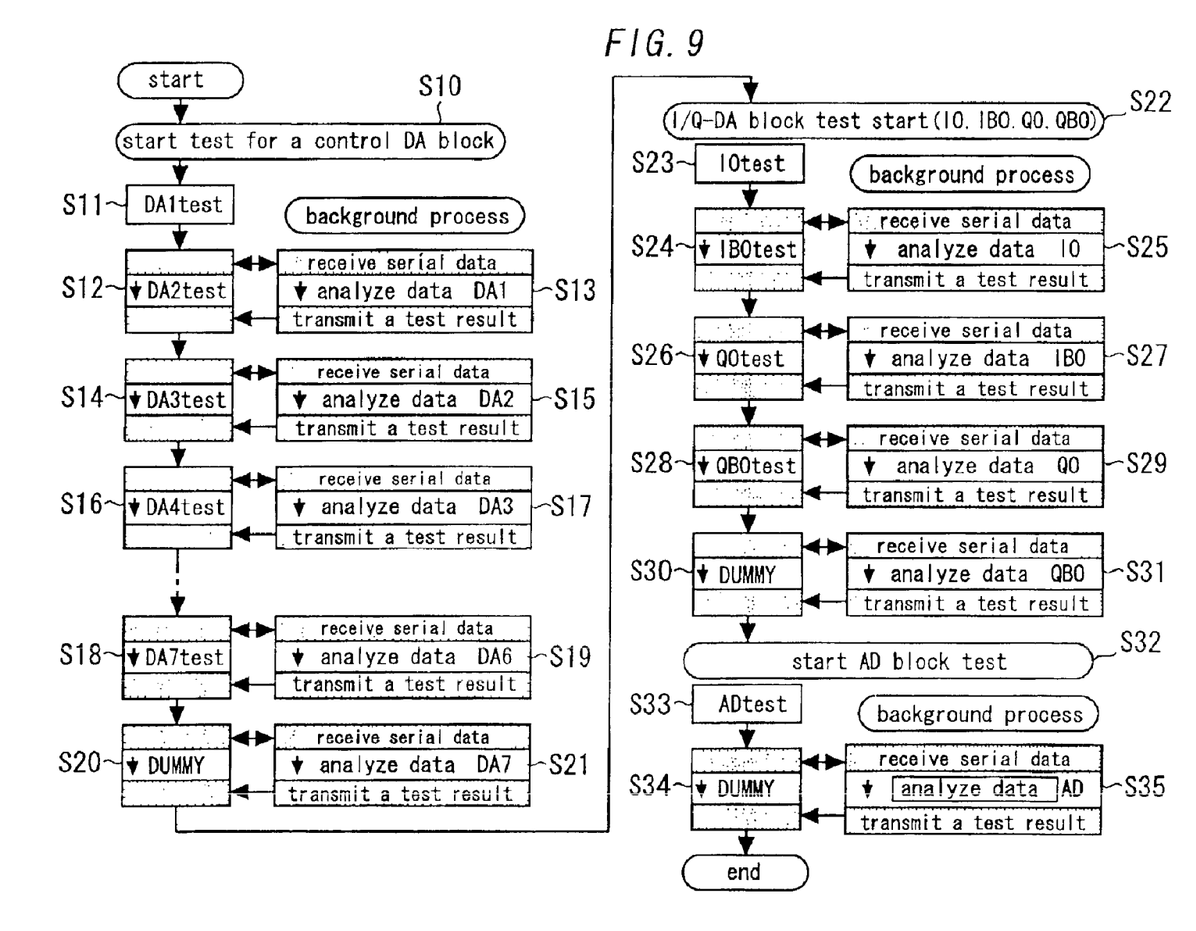
FIG. 9 is a specific test analysis flowchart pertaining to tests for a semiconductor integrated circuit.

FIG. 9 is a specific test analysis flowchart pertaining to tests for a semiconductor integrated circuit according to the present invention. More specifically, FIG. 9 is a flowchart pertaining to tests for a semiconductor integrated circuit to be used in a portable cellular phone. The portable cellular phone employs a plurality of integrated circuits including digital-to-analog converter circuits and analog-to-digital converter circuits. In the portable cellular phone, seven digital-to-analog converter circuits 52 are provided in a control DA block. In FIG. 9, the seven digital-to-analog converter circuits 52 are indicated as DA1 through DA7.

The portable cellular phone has an IQ-DA block consisting of four output circuits including digital-to-analog converter circuits. The four output circuits are indicated by IO, IBO, QO, and QBO. The portable cellular phone further includes one analog-to-digital converter circuit 51, and this analog-to-digital converter circuit 51 is indicated as AD in FIG. 9.

According to the flowchart shown in FIG. 9, commencement of a test for a control DA block (DA1 through DA7) shown in step S10 is first effected. In the control DA block, tests for the seven digital-to-analog converter circuits DA1 through DA7 and analysis of the tests are performed. In step S11, a test for (or measurement of) DA1 is performed, and digital test data output from the DA1 are stored in either of the memory banks 66A and 66B. Processing pertaining to steps S12 and S13 are performed simultaneously. In step S12, a test for DA2 is performed. In step S13, the DSP analysis section 69 analyzes measured data pertaining to DA1. In connection with analysis of measured data, the DSP analysis section 69 first receives serial data from the tester 40, thus starting analysis. Finally, the DSP analysis section 69 transmits a test result to the tester 40, thus completing analysis. Processing pertaining to step S14 and that pertaining to S15 are performed concurrently. In step S14, a test for DA3 is performed. In step S15, measured data pertaining to DA2 are analyzed. A test for DA4 to be effected in step S16 and analysis of measured data concerning DA3 to be effected in step S17 are performed simultaneously. Further, a test for DA6 and analysis of measured data pertaining to DA5 are performed. In step S18 shown in FIG. 9, a test for DA7 and analysis of measured data pertaining to DA6 are performed. In step S21, when analysis of measured data pertaining to DA7 is effected, in step S20 a blank test is effected for dummy (DUMMY).

Subsequently, in step S22 an I/Q-DA block test shown in step S22 (IO, IBO, QO, and QBO) is commenced. The test is also for testing digital-to-analog converter circuits provided in the output circuits IO, IBO, QO, and QBO. As in the case of the previous tests, parallel analysis processing is executed. In step S23, a test for IO is performed. Processing pertaining to step S24 and processing pertaining to step S25 are to be performed in parallel with each other. In step S24, a test for IBO (i.e., writing of data) is performed. In step S25, analysis of measured data pertaining to IO (i.e., reading of data) is performed. Similarly, a test for QO to be effected in step S26 and analysis of measured data concerning IBO to be effected in step S27 are performed in parallel with each other. Further, a test for QBO to be effected in step S28 and analysis of measured data concerning QO to be effected in step S29 are performed simultaneously. Subsequently, during the course of a dummy test pertaining to step S30, analysis of measured data pertaining to QBO pertaining to step S31 is performed. Next, a test for an AD block pertaining to step S32 is commenced. After a test for AD has been performed in step S33, during the course of a dummy test pertaining to step S34 analysis of measured data concerning AD is performed in step S35, thus completing tests.

In the memory banks 66A and 66B constituting two memory locations, a test (i.e., writing of test data) and analysis of test data (i.e., reading and uploading of test data to an analysis section) are performed in parallel with each other, thus achieving a 50% reduction in test time.

Second Embodiment

Figure 3:
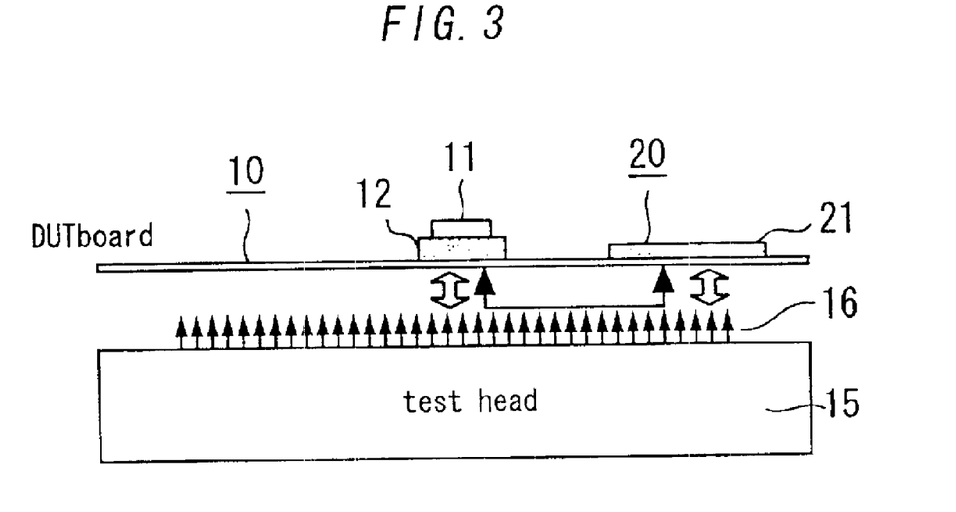
FIG. 3 is a side view of a DUT section of a test apparatus for testing a semiconductor integrated circuit according to a second embodiment.

FIG. 3 is a side view of a DUT section of a test apparatus for testing a semiconductor integrated circuit according to a second embodiment of the present invention. In the second embodiment, the BOST board 21 according to the first embodiment is placed on an upper surface of the DUT board 10. Even in the second embodiment, a molded semiconductor integrated circuit is fitted to a socket 12 provided on the DUT board 10, and an analog-to-digital converter 51 and a digital-to-analog converter 52 are tested.

As shown in FIG. 3, the BOST board 21 is mounted on an upper surface on the right side of the DUT board 10. In this area, the DUT board 10 and the BOST board 21 are interconnected, and signals are exchanged with a test head 15. The components provided on the BOST board 20 are identical in layout with those provided on the BOST board 20 shown in FIG. 1. Further, the BOST board 20 is identical in circuit configuration with that shown in FIG. 2.

Third Embodiment

Figures 4A, 4B:
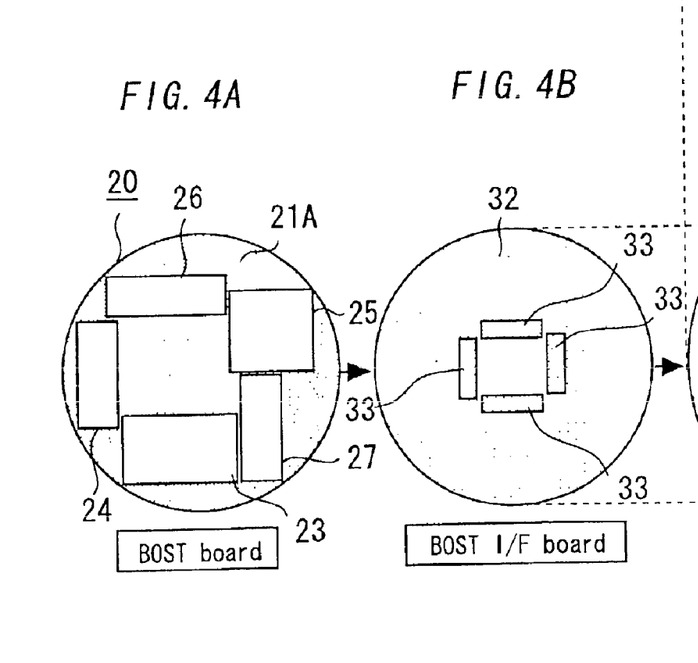
FIGS. 4A through 4D show the configuration of a DUT section of an apparatus for testing a semiconductor integrated circuit according to a third embodiment.
Figure 4C:
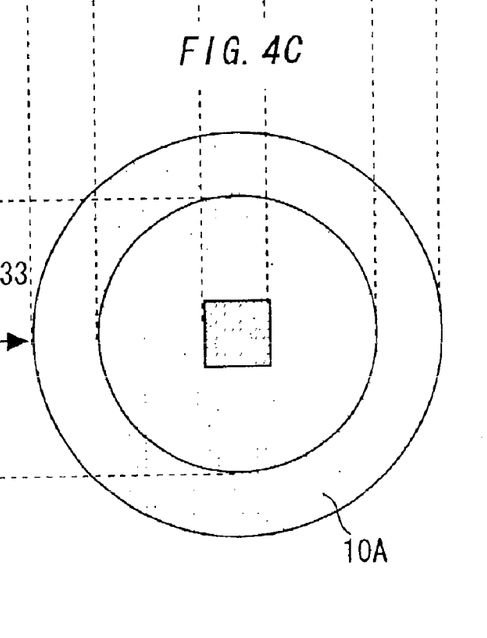
Figure 4D:
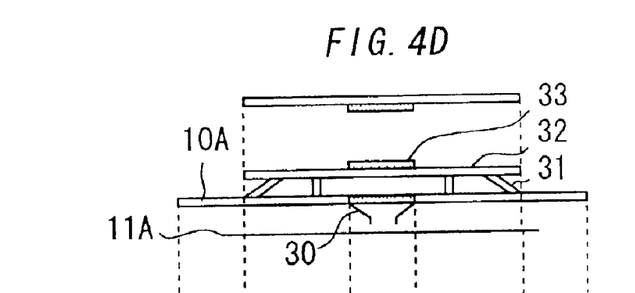

FIGS. 4A through 4D show the configuration of a DUT section of an apparatus for testing a semiconductor integrated circuit according to a third embodiment of the present invention. FIG. 4A is a top view of a BOST board 21; FIG. 4B is a top view of a BOST-IF board; FIG. 4C is a top view of the DUT board 10A; and FIG. 4D is a side view of the BOST board 21A, the BOST-IF board, and the DUT board 10A. In the third embodiment, a semiconductor integrated circuit in the form of a wafer is used as a device under test. The DUT board 10A is a probe card and is constituted in the form of a circle. A plurality of probes 30 to be connected to the wafer 11A are provided on a lower center surface of the DUT board 10A. A BOST-IF board 32 is provided on the DUT board 10A by way of connection channel members 31. A connector 33 is attached to the top of the BOST-IF board 32. A BOST board 21A constituting the BOST device 20 is also constituted in the form of a circle. As in the case of the first embodiment, the AD/DA measurement section 23, the controller section 24, the memory section 26, the DSP analysis section 25, and the power supply section 27 are provided on top of the BOST board 21A.

In terms of configuration of the electric circuit, the test apparatus according to the third embodiment is identical with that shown in FIG. 2 according to the first embodiment. A probe 30 is brought into contact with a plurality of terminals located in an area corresponding to a chip mounted on the wafer 11A, and a test identical with that performed in the first embodiment is performed. Areas corresponding to chips mounted on the wafer 11A are shifted sequentially, and adjacent areas corresponding to chips are tested sequentially.

Fourth Embodiment

Figure 5A:
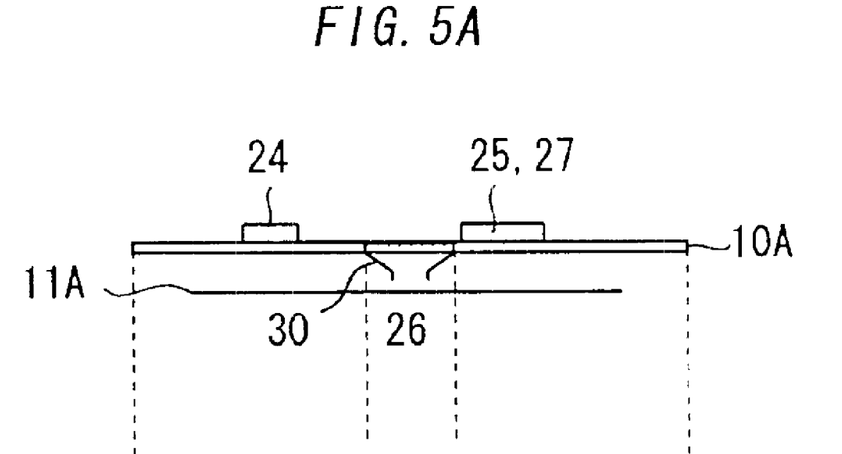
FIGS. 5A and 5B show a DUT section of a test apparatus for testing a semiconductor integrated circuit according to a fourth embodiment.
Figure 5B:
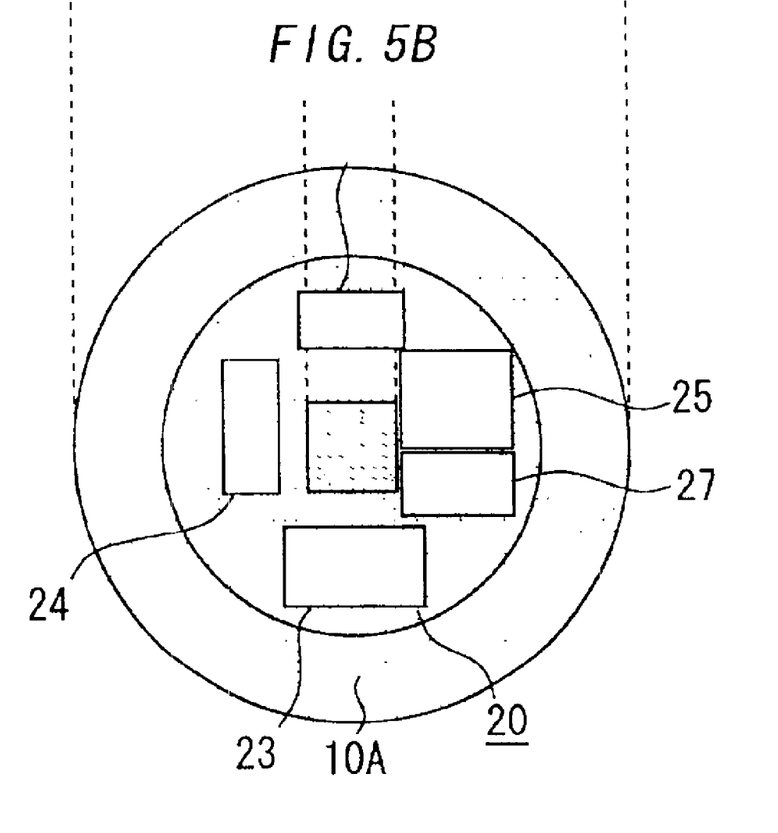

FIGS. 5A and 5B show a DUT section of a test apparatus for testing a semiconductor integrated circuit according to a fourth embodiment of the present invention. FIG. 5A is a side view of the test apparatus, and FIG. 5B is a top view of the same. In the fourth embodiment, a BOST board 21A is omitted. Further, a BOST-IF board 32 and connection channel members 31 are omitted. All the components constituting the BOST device 20: that is, an AD/DA measurement section 23, a control section 24, a memory section 26, a DSP analysis section 25, and a power supply section 27, are provided on the upper surface of the DUT board 10A having the probes 30. Required connection of the components has been made.

The test apparatus according to the fourth embodiment is identical in circuit configuration with that shown in FIG. 2 and described in connection with the first embodiment. The A/D converter circuits 51 and the D/A converter circuits 52 provided in the DUT 11 are tested in the same manner as in the first embodiment.

Even in the second, third, and fourth embodiments, the BOST device 20 or the BOST board 21 or 21A is disposed in the vicinity of the DUT board 10 or 10A. Tests are performed in the same manner as in the first embodiment, thereby improving the accuracy and speed of the tests and reducing the cost of the test apparatus. Further, adoption of the memory/analysis changeover circuit 80 described in connection with the first embodiment enables tests (measurement) and analysis of test results to be performed at higher speed and more efficiently.

Fifth Embodiment

Figure 6:
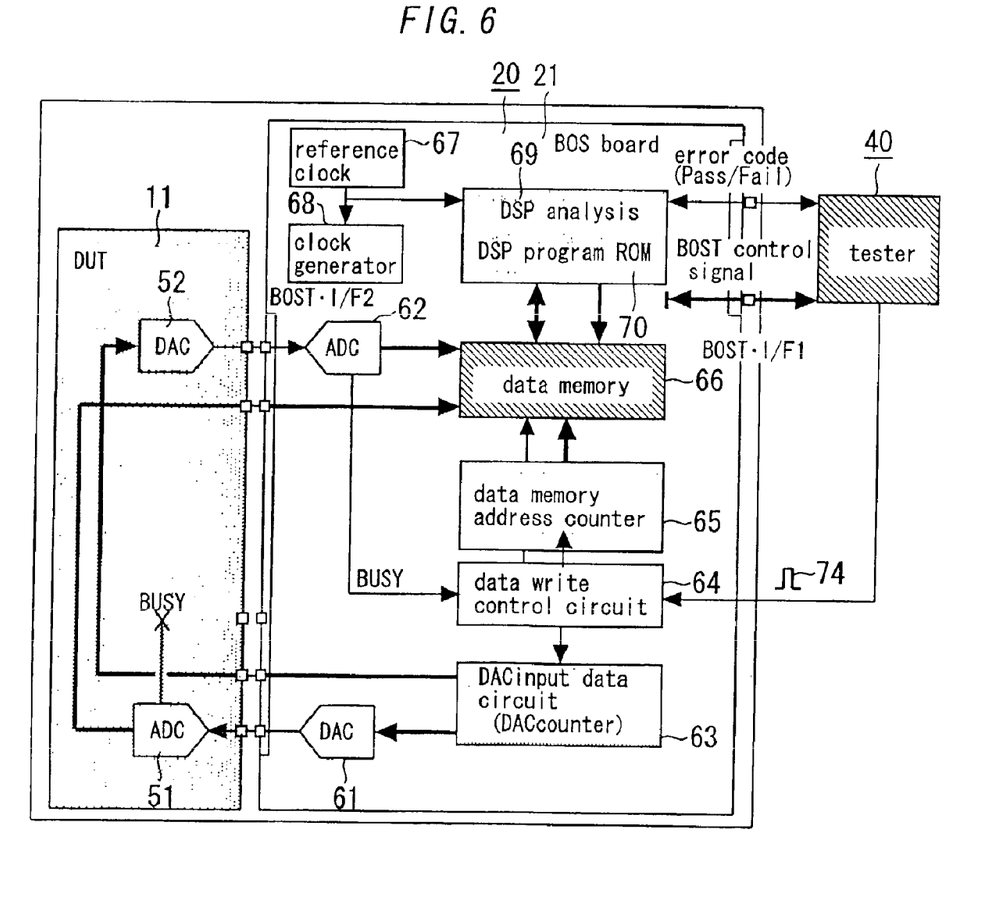
FIG. 6 is a block diagram showing a circuit configuration of an apparatus for testing a semiconductor integrated circuit according to a fifth embodiment.

FIG. 6 is a block diagram showing a circuit configuration of an apparatus for testing a semiconductor integrated circuit according to a fifth embodiment of the present invention. In the fifth embodiment, the analog-to-digital converter circuit 51 of the DUT 11 does not produce any BUSY signal. Therefore, the tester 40 supplies a trigger signal 74 to the BOST board 21, thereby digitally advancing operation of the data circuit 63 and an address of the measured data memory 66. Further, the analog-to-digital converter circuit 62 of the BOST board 21 can be configured so as to produce a BUSY signal. Hence, the BUSY signal can be used also as the trigger signal 74. In other respects, the test apparatus is identical in configuration with that shown in FIG. 2.

Even in the fifth embodiment, the trigger signal 74 transmitted from the tester 40 to the BOST device 20 is a digital signal. An analog signal system susceptible to the influence of noise is not additionally provided between the tester 40 and the BOST device 20. As in the case of the first embodiment, the accuracy and speed of a test can be increased. As a result of adoption of the memory/analysis changeover circuit 80 described in connection with the first embodiment, tests (measurement) and analysis of test results can be performed at a higher speed and more efficiently.

Sixth Embodiment

Figure 10:
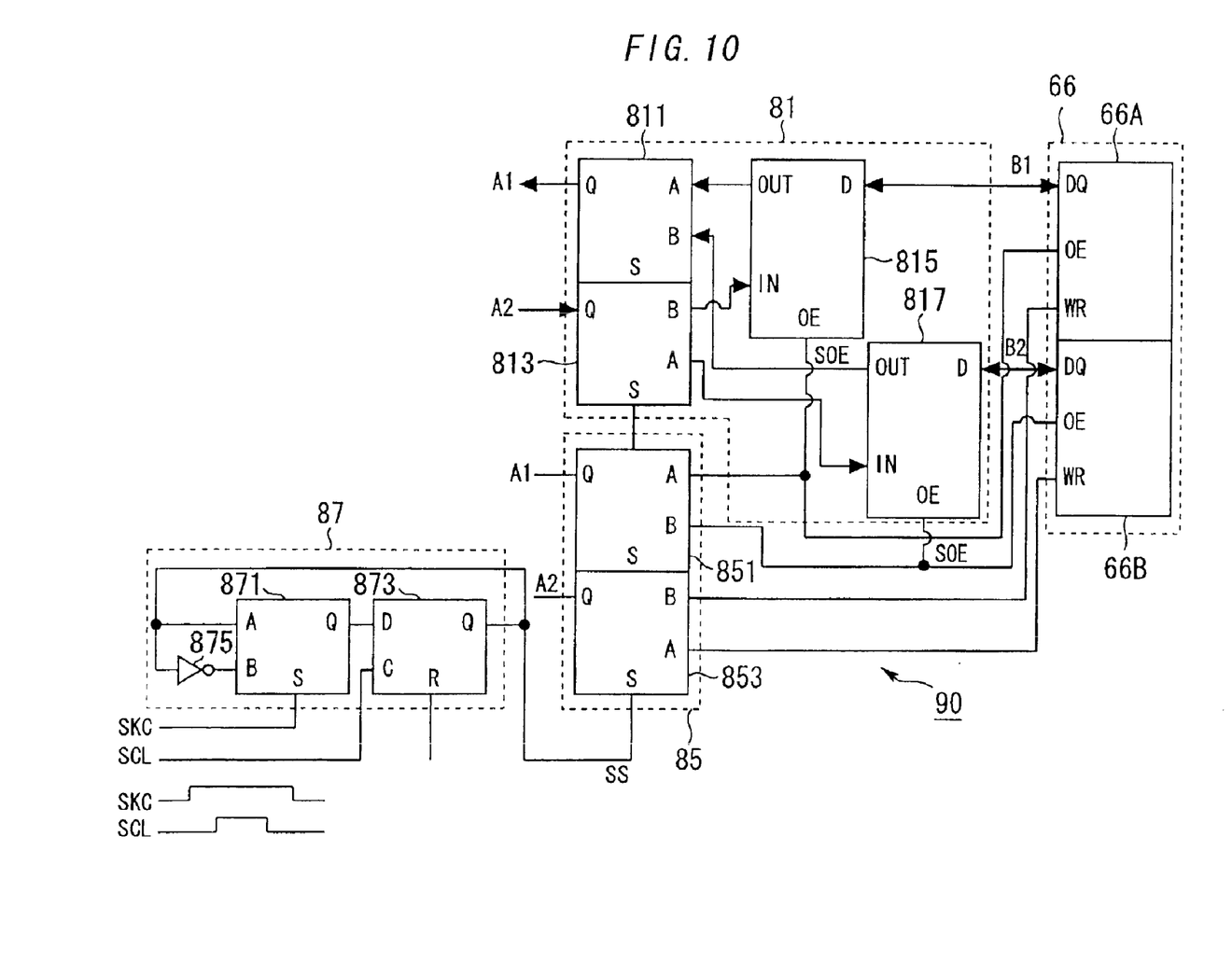
FIG. 10 is a block diagram showing a memory/analysis changeover circuit employed in an apparatus for testing a semiconductor integrated circuit according to a sixth embodiment.

FIG. 10 is a block diagram showing a memory/analysis changeover circuit 90 employed in an apparatus for testing a semiconductor integrated circuit according to a sixth embodiment of the present invention. The memory/analysis changeover circuit 90 corresponds to another embodiment of the memory/analysis changeover circuit 80 described in connection with the first embodiment and shown in FIG. 7.

In the memory/analysis changeover circuit 90 shown in FIG. 10, the data connection changeover circuit 81 of the memory/analysis changeover circuit 80 shown in FIG. 7 comprises a data output changeover selector 811; a data input changeover selector 813; an I/O changeover selector 815 for the memory bank 66A; and an I/O changeover selector 817 for the memory bank 66B. The data output changeover selector 811 has terminal A, terminal B, terminal Q, and terminal S. The terminal Q constitutes terminal A1 of the data connection changeover circuit 81 and is connected to the DSP analysis section 69. The data input changeover selector 813 also has terminal A, terminal B, terminal Q, and terminal S. The terminal Q constitutes terminal A2 of the data connection changeover circuit 81 and is connected to ADC/DAC measurement section 23. In the first connection state, each of the data output changeover selector 811 and the data input changeover selector 813 connects the terminal Q to the terminal A. In the second connection state, each of the data output changeover selector 811 and the data input changeover selector 813 connects the terminal Q to the terminal B. Switching between the first and second connection states is performed by a changeover signal SS supplied to the terminal S of the data output changeover selector 811 and to the terminal S of the data input changeover selector 813.

The I/O changeover selector 815 for the memory bank A has terminal OUT, terminal IN, terminal D, and terminal OE. The terminal D constitutes terminal B1 of the data connection changeover circuit 81 and is connected to data terminal DQ of the memory bank 66A. The terminal OUT of the I/O changeover selector 815 is connected to the terminal A of the data output changeover selector 811. The terminal IN of the data output changeover selector 811 is connected to terminal B of the data input changeover selector 813. The I/O changeover selector 817 for the memory bank 66B also has terminal OUT, terminal IN, terminal D, and terminal OE. The terminal D constitutes terminal B2 of the data connection changeover circuit 81 and is connected to data terminal DQ of the memory bank 66B. The terminal OUT of the I/O changeover selector 817 is connected to the terminal B of the data output changeover selector 811, and the terminal IN of the I/O changeover selector 817 is connected to the terminal A of the data input changeover selector 815. In the first connection state, each of the I/O changeover selectors 815 and 817 connects the terminal OUT to the terminal D. In the second connection state, each of the I/O changeover selectors 815 and 817 connects the terminal IN to the terminal D. Switching between the first and second connection states is performed by a changeover signal SOE supplied to the terminal OE.

In the first connection state, the terminals Q and A of the data output changeover selector 811 are connected together, and the terminals OUT and D of the I/O changeover selector 815 are connected together. As a result, the terminals A1 and B1 are connected together, and the terminals Q and A of the data input changeover selector 813 are connected together, and the terminals IN and D of the I/O changeover selector 817 are connected together. As a result, the terminals A2 and B2 are connected together. In the second connection state, the terminals Q and B of the data output changeover selector 811 are connected together, and the terminals OUT and D of the I/O changeover selector 817 are connected together. As a result, the terminals A1 and B2 are connected together. The terminals Q and B of the data input changeover selector 813 are connected together, and the terminals IN and D of the I/O changeover selector 815 are connected together. As a result, the terminals A2 and B1 are connected together.

The read/write clock connection changeover circuit 85 of the memory/analysis changeover circuit 80 is constituted of a memory read control bank changeover circuit 851 and a memory write control bank changeover circuit 853. The memory read control bank changeover circuit 815 has terminal Q, terminal A, terminal B, and terminal S. The terminal Q constitutes the terminal A1 of the read/write clock connection changeover circuit 85. The terminal A is connected to the terminal OE of the memory bank 66 and is connected to the terminal OE of the I/O changeover selector 815 for the memory bank A. The terminal B of the memory read control bank changeover circuit 851 is connected to the terminal OE of the memory bank 66B and to the terminal OE of the I/O changeover selector 817 of the bank A. The memory write control bank changeover circuit 853 has terminal Q, terminal A, terminal B, and terminal S. The terminal Q constitutes the terminal A2 of the read/write clock connection changeover circuit 85. The terminal A is connected to terminal WR of the memory bank 66B, and the terminal B is connected to terminal WR of the memory bank 66A, thus effecting switching from reading data from the memory bank 66A and writing data to the memory bank 66B to writing data to the memory bank 66A and reading data from the memory bank 66B, and vice versa.

In the first connection state, as a result of the terminals Q and A of the memory read control bank changeover circuit 851 being connected together, the OE terminal of the memory bank 66A is activated, thus bringing the memory bank 66A into a read-enabled state. Further, the OE terminal of the I/O changeover selector 815 for the memory bank 66A is activated. Further, the terminals OUT and D of the I/O changeover selector 815 are connected together, thus enabling loading data from the memory bank 66A to the DSP analysis section 69. In the I/O changeover selector 817 for the memory bank 66B, the terminals IN and D are connected together, thus enabling writing digital test data to the memory bank 66B. In the first connection state, the memory write control bank changeover circuit 853 activates the terminal WR of the memory bank 66B, thus bringing the memory bank 66B into a write-enabled state.

In the second connection state, the terminals Q and B of the memory read control bank changeover circuit 851 are connected together, thereby activating the OE terminal of the memory bank 66B and bringing the memory bank 66B into a read-enabled state. Further, the terminal OE of the I/O changeable selector 817 for the memory bank 66B is activated. The terminals OUT and D of the I/O changeover selector 817 are connected together, and loading of data from the memory bank 66B to the DSP analysis section 69 is realized. Further, in the I/O changeable selector 815 for the memory bank 66A, the terminals IN and D are connected together, whereby writing of digital test data to the memory bank 66A is effected. In the first connection state, the memory write control bank changeover circuit 853 activates the terminal WR of the memory bank 66A, thus bringing the memory bank 66A into a write-enabled state.

The memory bank changeover signal generation section 87 has an A/B changeover selector 871, a flip-flop circuit 873, and an inverter 875. The A/B changeover selector 871 has terminals A, B, Q, and S. The flip-flop circuit 873 has terminals D, Q, and R. The inverter 875 is connected to the terminal B of the A/B changeover selector 871. The terminal A of the A/B changeover selector 871 and the terminal Q of the flip-flop 873 are connected together. Further, the terminal Q of the A/B changeover selector 871 and the terminal D of the flip-flop 873 are connected together. The memory changeover signal SKC output from the controller 89 is supplied to the terminal S of the A/B changeover selector 871. The clock-in signal SCL is supplied to the terminal R of the flip-flop circuit 873. The memory changeover signal SKC has a large width, whereas the clock-in signal SCL is smaller in width the memory changeover signal SKC. The memory bank changeover signal SS is produced at the terminal Q of the flip-flop 873 and is reversed at respective rises of the memory changeover signal SKC. The clock-in signal is used for latching the memory bank changeover signal SS.

Seventh Embodiment

Figure 11:
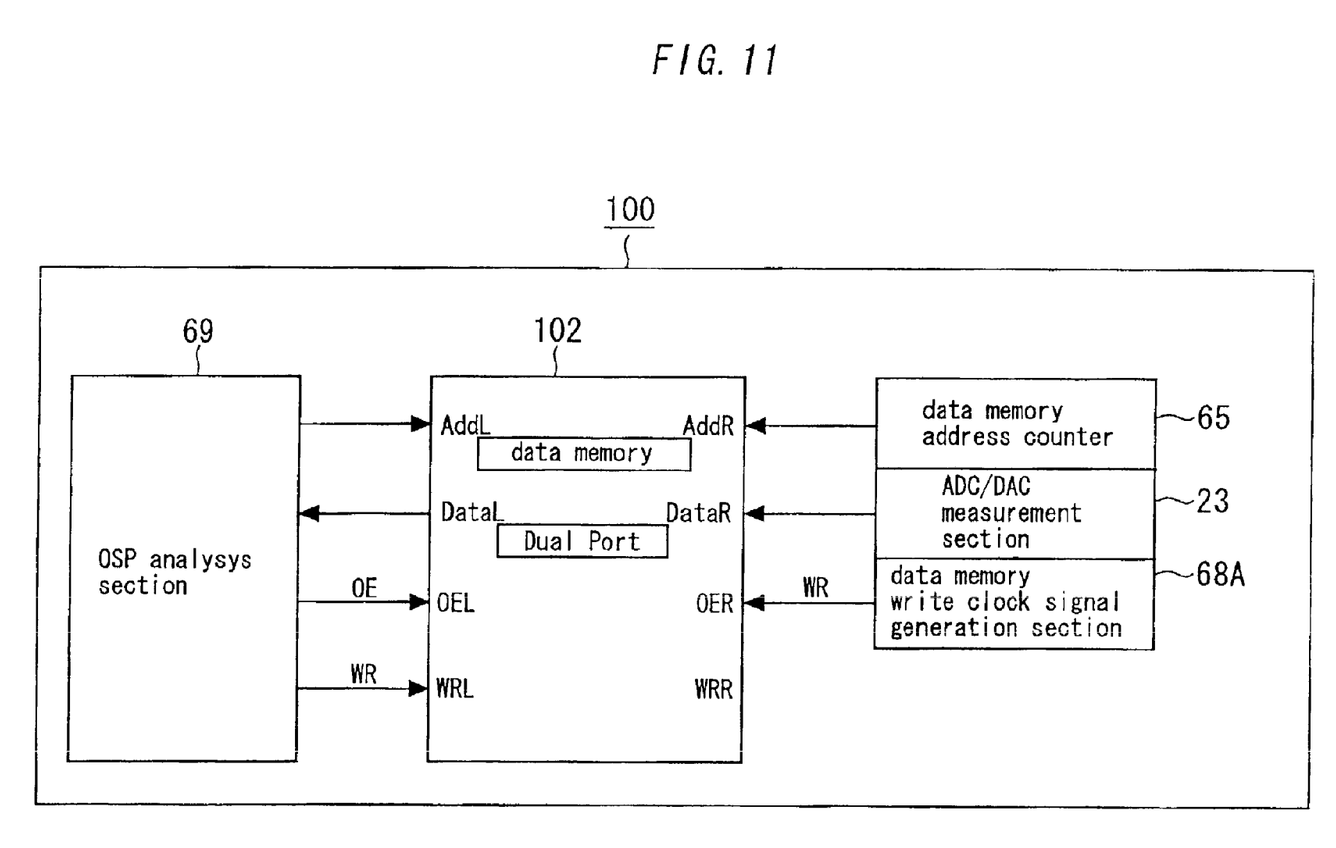
FIG. 11 is a block diagram showing a memory/analysis changeover circuit employed in an apparatus for testing a semiconductor integrated circuit according to a seventh embodiment.

FIG. 11 is a block diagram showing a memory/analysis changeover circuit 100 employed in an apparatus for testing a semiconductor integrated circuit according to a seventh embodiment of the present invention. The memory/analysis changeover circuit 100 corresponds to a modification of the memory/analysis changeover circuit 80 described in connection with the first embodiment and shown in FIG. 7.

The memory/analysis changeover circuit 100 is constituted while dual-port memory 102 is taken as a core of the changeover circuit 100.

The dual-port memory 102 has a pair of data terminals DataR and DataL, a pair of address terminals AddR and AddL, a pair of output-enabled signal terminals OER and OEL, and a pair of write-enabled signal terminals WRR and WRL. The dual-port memory 102 has two internal memory sections. Under control of the terminals, the dual-port memory 102 performs the same function as does the memory/analysis section 80 shown in FIG. 7. Use of the dual-port memory 102 enables a reduction in the number of components.

Eighth Embodiment

In the previous embodiments, each of the DUTs 11 and 11A includes both the analog-to-digital converter circuit 51 and the digital-to-analog converter circuit 52. Even when each of the DUTs 11 and 11A includes either the analog-to-digital converter circuit 51 or the digital-to-analog converter circuit 52, the present invention can yield an advantage. Even when a DUT comprises a plurality of analog-to-digital converter circuits 51 or a plurality of digital-to-analog converter circuits 52, the DUT can be tested with a high degree of accuracy, at high speed, and through use of a low-cost test apparatus.

Ninth Embodiment

A method of testing a semiconductor integrated circuit using any one of the plurality of pieces of test apparatus described in connection with the first through eighth embodiments is also effective for testing a semiconductor integrated circuit more accurately and at higher speed. Particularly, storage (writing) of digital test data and analysis of the digital test data are processed in parallel with each other. As a result, the test can be performed at much higher speed, thus improving productivity of the semiconductor integrated circuit.

The features and advantages of the present invention may be summarized as follows.

In the apparatus for testing a semiconductor integrated circuit according to the present invention, a test ancillary device disposed in the vicinity of a test circuit board is provided with data memory and an analysis section. The data memory is divided into two memory sections such that, when digital test data are stored in one memory section, the digital test data that have already been stored in the other memory section are loaded for analysis purpose. An analog-to-digital converter circuit or digital-to-analog converter circuit of a semiconductor integrated circuit can be tested more accurately and at higher speed, thus curtailing costs of the test apparatus.

In a case where data memory is constituted of two memory devices, a test can be performed more accurately and at a higher speed on a per-memory-device basis.

When each of the two memory devices is provided with input changeover means and output changeover means, a test can be performed more accurately and at higher speed while writing of data or reading of data is switched by means of the input and output changeover means.

When two memory sections are provided in one memory device, the number of circuit components can be reduced.

A method of testing a semiconductor integrated circuit uses the test apparatus in which a test ancillary device disposed in the vicinity of a test circuit board is provided with data memory and an analysis section and in which the data memory is divided into two memory sections such that, when digital test data are stored in one memory section, the digital test data that have already been stored in the other memory section are loaded for analysis purpose. According to the test method, a test for an analog-to-digital converter circuit or digital-to-analog converter circuit of a semiconductor integrated circuit can be performed more accurately and at higher speed, thus increasing the productivity of semiconductor integrated circuits.

It is further understood that the foregoing description is a preferred embodiment of the disclosed apparatus and that various changes and modifications may be made in the invention without departing from the spirit and scope thereof.

The entire disclosure of a Japanese Patent Application No. 2001-032596, filed on Feb. 8, 2001 including specification, claims drawings and summary, on which the Convention priority of the present application is based, are incorporated herein by reference in its entirety.

What is claimed is:

1. An apparatus for testing a semiconductor integrated circuit, comprising:

a test circuit board constructed so as to exchange a signal with a semiconductor integrated circuit under test, the semiconductor integrated circuit including an analog-to-digital converter circuit for converting an analog signal to a digital signal or a digital-to-analog converter circuit for converting a digital signal to an analog signal;

a test ancillary device disposed in the vicinity of the test circuit board, the test ancillary device including data memory for storing digital test data output from the analog-to-digital converter circuit or digital test data produced by converting analog test data output from the digital-to-analog converter circuit into a digital signal, and an analysis section for analyzing the digital test data stored in the data memory; wherein the data memory is divided into two memory sections such that, when digital test data is stored in one memory section, digital test data previously stored in the other memory section is loaded for analysis purpose.

2. The apparatus for testing a semiconductor integrated circuit according to claim 1, wherein the data memory has first and second memory devices, and the first and second memory devices respectively include the first and second memory sections.

3. The apparatus for testing a semiconductor integrated circuit according to claim 2, wherein the test ancillary device has memory input changeover means, and the memory input changeover means stores the digital test data into the first memory device or the second memory device in a switchable manner.

4. The apparatus for testing a semiconductor integrated circuit according to claim 2, wherein the test ancillary device has memory output changeover means, and the memory output changeover means uploads an output from the first memory device or an output from the second memory device to the analysis section in a switchable manner.

5. The apparatus for testing a semiconductor integrated circuit according to claim 1, wherein the data memory is constituted of one memory device having the first and second memory sections therein.

6. A method of testing a semiconductor integrated circuit, the semiconductor integrated circuit including at least one of an analog-to-digital converter circuit for converting an analog signal to a digital signal and a digital-to-analog converter circuit for converting a digital signal to an analog signal, the method using a test circuit board configured to exchange one or more signals with the semiconductor integrated circuit and a test ancillary device coupled to the test circuit board and including a memory having a first and second sections, the method comprising:

storing first digital test data derived from the semiconductor integrated circuit in the first memory section while providing second digital test data derived from the semiconductor integrated circuit and data previously stored in the second memory section to an analysis device configured to analyze digital test data stored in the data memory;

wherein the first and second digital test data are one of an output from the analog-to-digital converter circuit or digital test data produced by converting analog test data output from the digital-to-analog converter circuit into a digital signal.

7. The method of claim 6, wherein the semiconductor integrated circuit includes both an analog-to-digital converter circuit and digital-to-analog converter circuit, and the test ancillary device is configured to alternatively store digital test data derived from the analog-to-digital converter circuit in a first mode of operation and digital test data derived from the digital-to-analog converter circuit and converted into a digital form in a second mode of operation.

8. The method of claim 6, further comprising providing a source analog signal to the semiconductor integrated circuit, wherein the digital test data stored in the test ancillary device memory is derived from the analog-to-digital converter circuit converting the source analog signal to digital form.

9. The method of claim 6, further comprising providing a source digital signal to the semiconductor integrated circuit.

10. The method of claim 6, further comprising performing a changeover operation on the test ancillary device memory such that additional digital test data can be stored in the second memory section while the first digital test data is provided to the analysis device.

11. The method of claim 10, wherein after the changeover operation, the test ancillary device does not store digital test data in the first memory section until after a subsequent changeover operation.

* * * * *